(12) United States Patent
Toyofuku

(10) Patent No.: US 6,883,428 B2
(45) Date of Patent: Apr. 26, 2005

(54) METHOD OF CONVEYING RECORDING MATERIAL AND DEVICE FOR CONTROLLING CONVEYING OF RECORDING MATERIAL

(75) Inventor: Takashi Toyofuku, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 784 days.

(21) Appl. No.: 09/808,014

(22) Filed: Mar. 15, 2001

(65) Prior Publication Data
US 2001/0022660 A1 Sep. 20, 2001

(30) Foreign Application Priority Data
Mar. 15, 2000 (JP) ........................................ 2000-073060

(51) Int. Cl.[7] ............................................... B41F 27/12
(52) U.S. Cl. ..................................... 101/477; 101/401.1
(58) Field of Search ................................ 358/1.6, 1.12; 101/477, 401.1, 484, 483, 463.1; 271/264, 266

(56) References Cited

U.S. PATENT DOCUMENTS 5,992,324 A * 11/1999 Rombult et al. ............ 101/477
6,715,422 B1 * 4/2004 Nishida ...................... 101/477

* cited by examiner

Primary Examiner—Leslie J. Evanisko
(74) Attorney, Agent, or Firm—Sughrue Mion, PLLC

(57) ABSTRACT

When an image is recorded on a recording material while concurrently transferring print data and conveying the recording material, the recording material at the time when exposure is stopped can be placed in a state before unprocessed at a high probability. Conveying of a photopolymer plate started concurrently with transfer of print data, is temporarily stopped on standby immediately before punch-hole forming processing. Therefore, when transfer of print data is stopped, the photopolymer plate can be placed in a reusable state at a high probability, and the number of waste photopolymer plates can be reduced. The standby time and the time at which conveying is restarted are determined based on a transfer rate of print data and a remaining conveying time. As a result, there is no possibility that delay of image recording processing caused by temporary stop may occur.

21 Claims, 10 Drawing Sheets

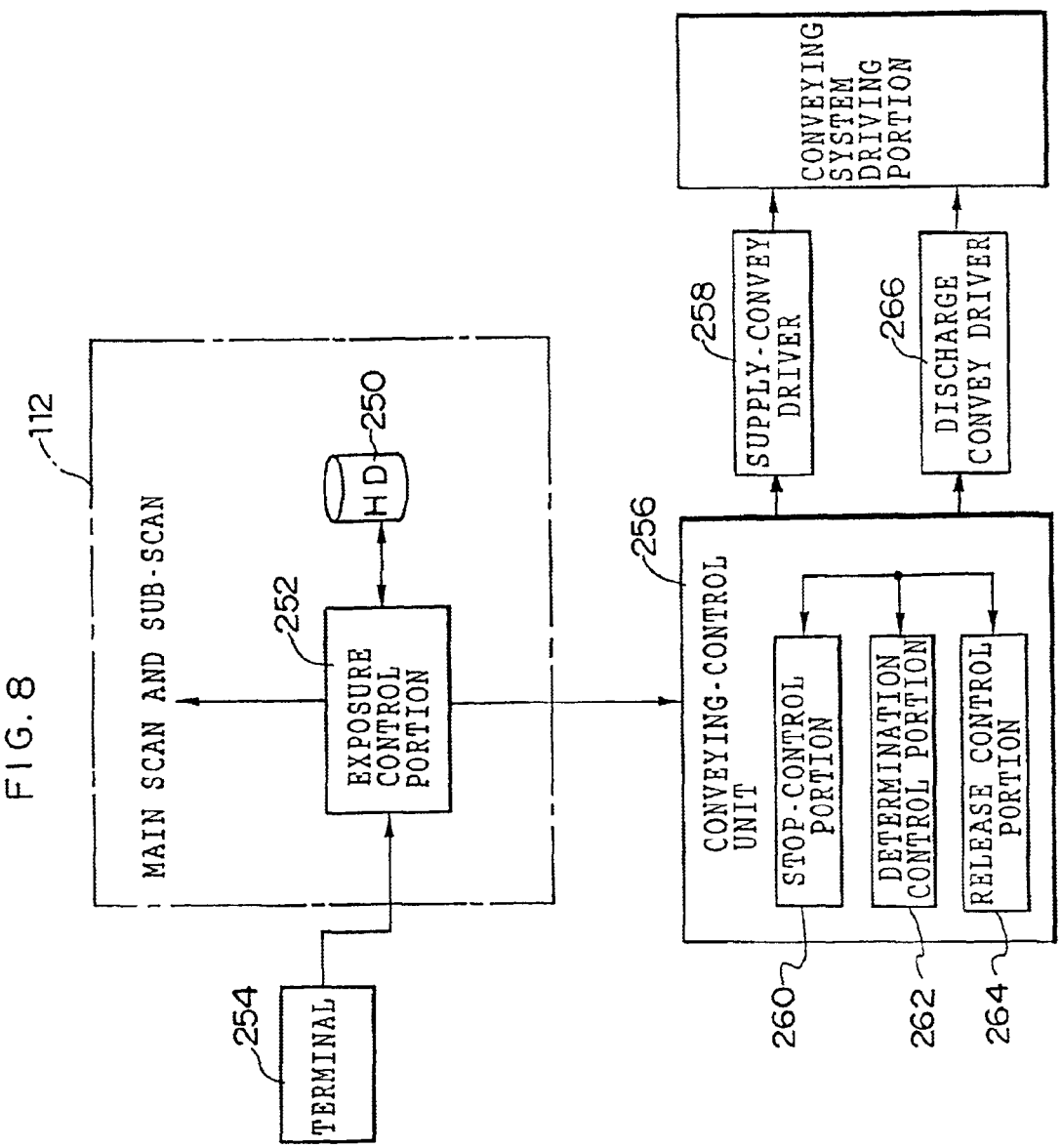

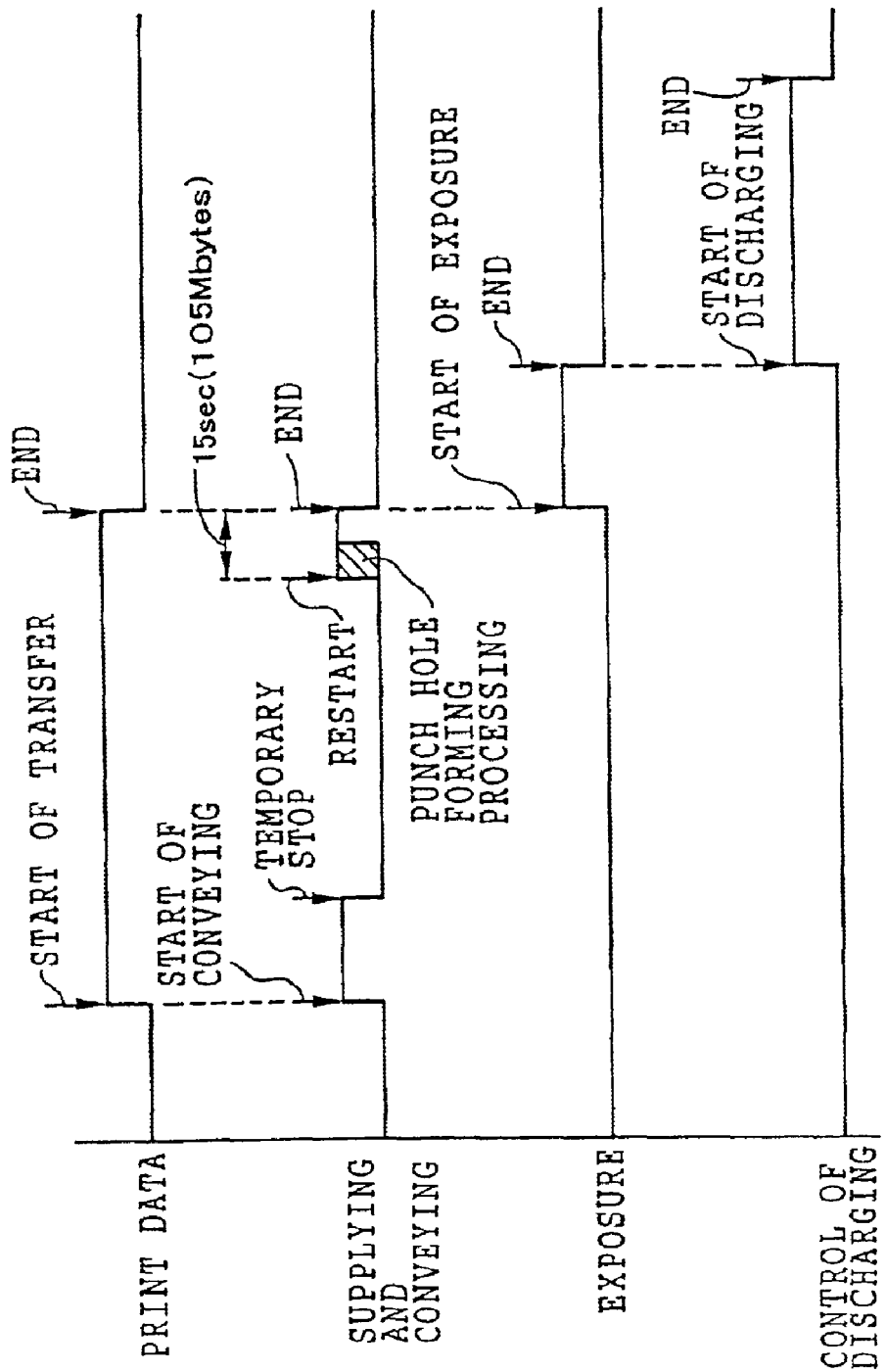

METHOD OF CONVEYING RECORDING MATERIAL AND DEVICE FOR CONTROLLING CONVEYING OF RECORDING MATERIAL

BACKGROUND OF THE INVENTION

1. Field of the Invention

The present invention relates to, in an image recording apparatus by which an image is recorded on a recording material based on print data transferred at a predetermined transfer rate, a method of conveying a recording material in which the recording material is conveyed to an image recording stage, and a device for controlling conveying of the recording material.

2. Description of the Related Art

A technique has been developed, wherein a printing plate (hereinafter referred to as a photopolymer plate) having a photosensitive layer (for example, a photopolymerization layer) provided on a support is used and an image is directly recorded on the photopolymerization layer of the photopolymer plate by a laser beam or the like (an automatic exposure apparatus for printing plates).

In such a technique, recording of an image on a photopolymer plate is rapidly carried out, and therefore, photopolymer plates need to be successively fed into an exposure section. Therefore, preferably, a plurality of photopolymer plates are in advance placed on standby at a predetermined position in a state of being stacked, and automatically taken out one-by-one and sent to an exposure stage of an exposure section. Further, it is preferable that the photopolymer plate sent thereto is conveyed along a predetermined proper conveying path.

The photopolymer plate is adapted to be wound around a print drum at the time of printing. In order that the photopolymer plate be positioned at this time, a process of forming a punch hole is provided in the automatic exposure apparatus for printing plates. The punch-hole forming process is carried out on a surface table which serves to effect sub-scan movement and is a base at the time of exposure for the photopolymer plate. The punch hole becomes a reference when an exposure is performed.

For this reason, the photopolymer plate transferred to the surface table is required so as to be positioned at a regular position.

Even if transfer of print data is stopped and exposure in the exposure section is cancelled, the printing plate with the punch holes formed thereon cannot be reused and is therefore discarded. On the other hand, in the case of a printing plate with no punch hole formed thereon, when transfer of print data is stopped and exposure in the exposure section is cancelled, the printing plate is discharged as is and can be reused, which results from that it suffers no change, namely, no punch hole formed thereon.

That is, handling of the printing plate after exposure processing has been cancelled based on stoppage of print-data transfer, varies depending on a state in which the operation of forming the punch hole is performed or not. Accordingly, preferably, cancellation of exposure processing is determined before the punch-hole forming operation is performed.

However, conveying of the printing plate, which is started in parallel with start of print-data transfer, is irrespective of transfer state of print data after start of print-data transfer, and in most cases, the printing paper arrives at the exposure stage in the first half period of the print-data transfer, and a probability at which the printing plate is saved due to stoppage (cancellation) of exposure, becomes low. As a result, there exists a drawback in that an amount of printing plates to be discarded, having punch holes formed thereon, increases.

For reference, the print data is adapted to be transferred from a terminal equipment such as an external personal computer, and an amount of the data is widely set in the range from 100 MB to 1 GB ("B" is an abbreviation for byte). Further, the transfer rate is set at 7 Mb/sec or thereabouts. Accordingly, the time required for transferring the minimum amount of data is about 14.3 seconds, and the time required for transferring the maximum amount of data is about 143 seconds. On the other hand, the time when the printing paper is conveyed from a conveying start position to a position in the punch hole forming process is about 15 seconds, and the time when the printing paper is conveyed to the exposure stage is about 30 seconds.

In view of such circumstances as described above, when exposure processing is cancelled, most of printing papers are practically wasted.

SUMMARY OF THE INVENTION

In view of the above-described facts, an object of the present invention is to provide a method of conveying a recording material and a device for controlling conveying of a recording material, in which when an image is recorded on a recording material while concurrently transferring print data and conveying the recording material, a probability at which the recording material at the time of exposure being stopped is placed in an unprocessed state, can be made higher.

A first aspect of the present invention is a method of conveying a recording material, in which a recording material is conveyed to an image recording stage in an image recording apparatus in which an image is recorded on the recording material based on print data transferred at a predetermined transfer rate, the method comprising the steps of: starting concurrent processing of transfer of the print data and conveying of the recording material; temporarily stopping conveying of the recording material, when a predetermined amount of the print data is not received, immediately before a process for working the recording material; calculating, based on the predetermined transfer rate, an amount of the print data which can be transferred in a time for which the recording material is conveyed from a position at which the recording material is temporarily stopped, to an image recording position; and restarting conveying of the recording material at a time at which an amount of print data which has not been transferred comes to the calculated amount of print data.

A second aspect of the present invention is characterized by that, in the first aspect of the present invention, when transfer of the print data is stopped until the recording material is temporarily stopped or during a period in which the recording material is temporarily stopped, the recording material is reused.

In accordance with the first aspect of the present invention, when transfer of the print data is started, conveying of the recording material is concurrently started.

A region in which the process for working the recording material is effected, is provided midway in the conveying path of the recording material. The recording material is positioned at the image recording position after having been subjected to the working process.

Conveying of the recording material is temporarily stopped before, preferably, immediately before the above-described working process. The conveying time required for which the recording material is conveyed from the temporarily stopping position to the image recording position, is recognized in advance, and the amount of print data which can be transferred in the conveying time is calculated. When the remaining amount of print data to be transferred coincides with the calculated amount of print data, conveying of the recording material is restarted.

As a result, the recording material is allowed to arrive at the image recording position without any delay for a termination time of transfer of print data. In other words, the time at which transfer of print data is completed, and the time at which conveying of the recording material is completed (that is, the time at which the recording material arrives at the image recording position), are allowed to coincide with each other.

The time at which transfer of print data is completed, and the time at which conveying of the recording material is completed, are made to coincide with each other due to the recording material being temporarily stopped immediately before the working process (that is, the coincidence therebetween is controlled by the time at which the recording material is temporarily stopped immediately before the working process). Therefore, an unchanged state of the recording material can be maintained as far as possible. Accordingly, when transfer of print data is stopped, in comparison with the conventional method, there is a high probability at which the recording material is placed in an unchanged state. As a result, as described in the second aspect of the present invention, unprocessed (unchanged) recording materials can be reused, and therefore, the number of waste recording materials can be minimized.

A third aspect of the present invention is characterized by that, in the first and second aspects of the present invention, the process for working the recording material is a process of positioning the recording material at a predetermined position and of forming at least one punch hole on the recording material.

According to the third aspect of the present invention, the process for working the recording material is a process for forming at least one punch hole on the recording material. For example, when the recording material is a printing plate, the printing plate is wound around a print drum after an image has been recorded thereon, and ink is applied thereto, and further, papers are printed. In this case, unless the printing plate is correctly positioned on and mounted at the print drum, color displacement occurs in a case of a color image. For this reason, based on the punch hole formed on the printing plate, the printing plate is positioned on the print drum.

Positioning of the printing plate for formation of a punch hole (in other words, a position at which a punch hole is formed on the printing plate) may affect the reference position for image recording. Therefore, a printing plate having a punch hole formed thereon cannot be reused by reason that the depth and dimensions of the punch hole vary depending on the kind of printing plate. Accordingly, due to the printing plate being placed on standby before formation of a punch hole, the number of waste printing plates can be reduced. So long as the same punching condition is provided, naturally, a printing plate having a punch hole formed thereon can be reused.

A fourth aspect of the present invention is a device for controlling conveying of a recording material, comprising: a transfer section for transferring print data; a conveying section which starts conveying of a recording material, based on start of transfer of print data by the transfer section, and conveys the recording material to a predetermined recording stage; a stop-control section for temporarily stopping conveying of the recording material when a predetermined amount of print data is not received at a position, at which the recording material can be positioned at the recording stage in a predetermined time, midway in a conveying path of the conveying section; a determination section which determines whether a remaining amount of print data transferred from the transfer section comes to an amount of print data which can be transferred in the predetermined time based on a transfer rate of the print data; a release section which releases temporarily stopping conveying of the recording material by the stop-control section when the remaining amount of print data and the amount of print data which can be transferred in the predetermined time based on the transfer rate of the print data coincide with each other in the determination section; and a discharging section for discharging the recording material when transfer of print data from the transfer section is stopped before temporarily stopping conveying of the recording material by the stop-control section is released by the release section (by the determination section).

A fifth aspect of the present invention is characterized by that, in the fourth aspect of the present invention, the predetermined time is set based on the process for working the recording material, and the position at which the recording material is stopped by the stop-control section, is provided at a position in which position the recording material is located before the process for working the recording material is carried out.

According to the fourth aspect of the present invention, when transfer of print data is started by the transfer means, (start of the transfer is notified and) conveying of the recording material is started by the conveying means. Conveying of the recording material is stopped by the stop-control means midway in the conveying path of the recording material conveyed by the conveying means. The position at which conveying of the recording material is stopped (that is, the stop position), is a position at which the recording material can be conveyed from the stop position to an image recording position in a predetermined time and can be positioned thereat.

At the stop position, a determination is made by the determination means as to whether the remaining amount of print data transferred from the transfer means coincides with an amount of print data which can be transferred in a predetermined time based on the transfer rate of print data.

When it is determined by the determination means that the remaining amount of print data coincides with the amount of print data which can be transferred in the predetermined time based on the transfer rate of print data, temporary stop of the recording material by the stop-control means is released by the release means, and conveying of the recording material is restarted.

On the other hand, when transfer of print data from the transfer means is stopped before the above-described release of temporary stop is carried out by the release means based on the determination of the determination means, the recording material is discharged by the discharging means.

As described above, as long as the recording material is temporarily stopped midway in the conveying path of the recording material, for example, if the recording material is not processed due to the period of temporary stop as described in the fifth aspect of the present invention, the recording material is discharged in the same state as at the time when conveying is started, it can be reused. Further, conveying of the recording material is restarted based on the remaining amount of print data, and therefore, the recording material can be positioned at the recording stage without any delay for the time at which transfer of print data is completed.

A sixth aspect of the present invention is characterized by that the process for working the recording material is a process of positioning the recording material at a predetermined position and of forming at least one punch hole on the recording material.

A seventh aspect of the present invention is characterized by that, in the fourth, fifth, and sixth aspects of the present invention, the recording material is a printing plate having a photosensitive layer on a support, and the device is applied to an automatic exposure apparatus for printing plates, in which a printing plate is passed onto a surface table while being conveyed in a predetermined direction, and located at a regular position on the surface table, and thereafter, positioning punch holes used when the printing plate is wound around a print drum at a predetermined position, are formed on the printing plate, and the printing plate is moved to a recording stage by moving the surface table, and an image is recorded on the printing plate based on the print data.

According to the sixth and seventh aspects of the present invention, the device for controlling conveying of a recording material according to the present invention is applied to an automatic exposure apparatus for printing plates. In the automatic exposure apparatus for printing plates, an operation of forming punch holes, which punch holes become a reference when the printing plate is wound around a print drum midway in the conveying path and also becomes reference positions for image recording at the recording stage, that is, an uncommon working process (for processing the recording material) effected midway in the conveying path in a normal image recording apparatus, is necessarily provided. Therefore, it is very effective that the present invention is applied to the automatic exposure apparatus.

An eighth aspect of the present invention is a method of conveying a recording material, in which a recording material is conveyed to an image recording position in an image recording apparatus in which an image is recorded on the recording material based on print data transferred at a predetermined transfer rate, the method comprising the steps of: starting transfer of the print data and conveying of the recording material; temporarily stopping conveying of the recording material at a predetermined position in a conveying path of the recording material; calculating, based on the predetermined transfer rate, an amount of print data which can be transferred in a time required for which the recording material is conveyed from the predetermined position at which the recording material is temporarily stopped, to the image recording position; and restarting conveying of the recording material when an amount of the print data which has not been transferred, and the calculated amount of print data coincide with each other.

A ninth aspect of the present invention is characterized by that, in the eighth aspect of the present invention, the predetermined position is related to a region in which predetermined processing is effected for the recording material.

A tenth aspect of the present invention is characterized by that, in the eighth aspect of the present invention, a time at which the recording material arrives at the image recording position is substantially concurrent with a time at which transfer of the print data is completed.

An eleventh aspect of the present invention is characterized by that, in the ninth aspect of the present invention, the predetermined processing effected for the recording material is formation of at least one punch hole on the recording material.

A twelfth aspect of the present invention is characterized by that, in the eighth aspect of the present invention, a time at which the recording material arrives at the image recording position is substantially concurrent with a time at which transfer of the print data is completed.

A thirteenth aspect of the present invention is characterized by that, in the eighth aspect of the present invention, a time at which the image can be recorded on the recording material at the image recording position, is substantially concurrent with a time at which transfer of the print data is completed.

A fourteenth aspect of the present invention is a device for controlling conveying of a recording material, comprising: a transfer section for transferring print data: a conveying section for conveying a recording material to an image recording position; a stop-control section which temporarily stops conveying of the recording material at a predetermined position midway in a conveying path of the conveying section; a determination section which makes a determination as to whether an amount of print data which has not been transferred among the print data transferred from the transfer section, coincides with an amount of print data which can be transferred in a time required for which the recording material is conveyed from the predetermined position at which the recording material is temporarily stopped, to the image recording position, which time is based on the predetermined transfer rate; and a release section which releases temporary stop of the recording material by the stop-control section when the amount of the print data which has not been transferred, and the amount of print data which can be transferred, coincide with each other in the determination section.

A fifteenth aspect of the present invention is characterized by, in the fourteenth aspect of the present invention, further comprising a discharging section which discharges the recording material when transfer of print data from the transfer section is stopped.

A sixteenth aspect of the present invention is characterized by that, in the fourteenth aspect of the present invention, the predetermined position at which the recording material is temporarily stopped by the stop-control section, is related to a region in which predetermined processing is effected for the recording material.

A seventeenth aspect of the present invention is characterized by that, in the sixteenth aspect of the present invention, the predetermined processing effected for the recording material is formation of at least one punch hole on the recording material.

An eighteenth aspect of the present invention is characterized by that, in the fourteenth aspect of the present invention, the recording material is a printing plate having a photosensitive layer on a support, and positioning punch holes used when the printing plate is wound around a print drum, are formed in the printing plate, and the image is recorded on the printing plate based on the print data.

BRIEF DESCRIPTION OF THE DRAWINGS

FIG. 7A shows an initial state of the operation; FIG. 7B shows a state in which a photopolymer plate is lifted up; and FIG. 7C shows a state when the photopolymer plate is discharged.

FIG. 8 is a control block diagram which controls conveying of a photopolymer plate, which links with transfer of print data.

FIG. 9 is a timing chart (normal case) for controlling conveying of the photopolymer plate, which links with transfer of print data.

DESCRIPTION OF THE PREFERRED EMBODIMENTS

Overall Structure

Figure 1:
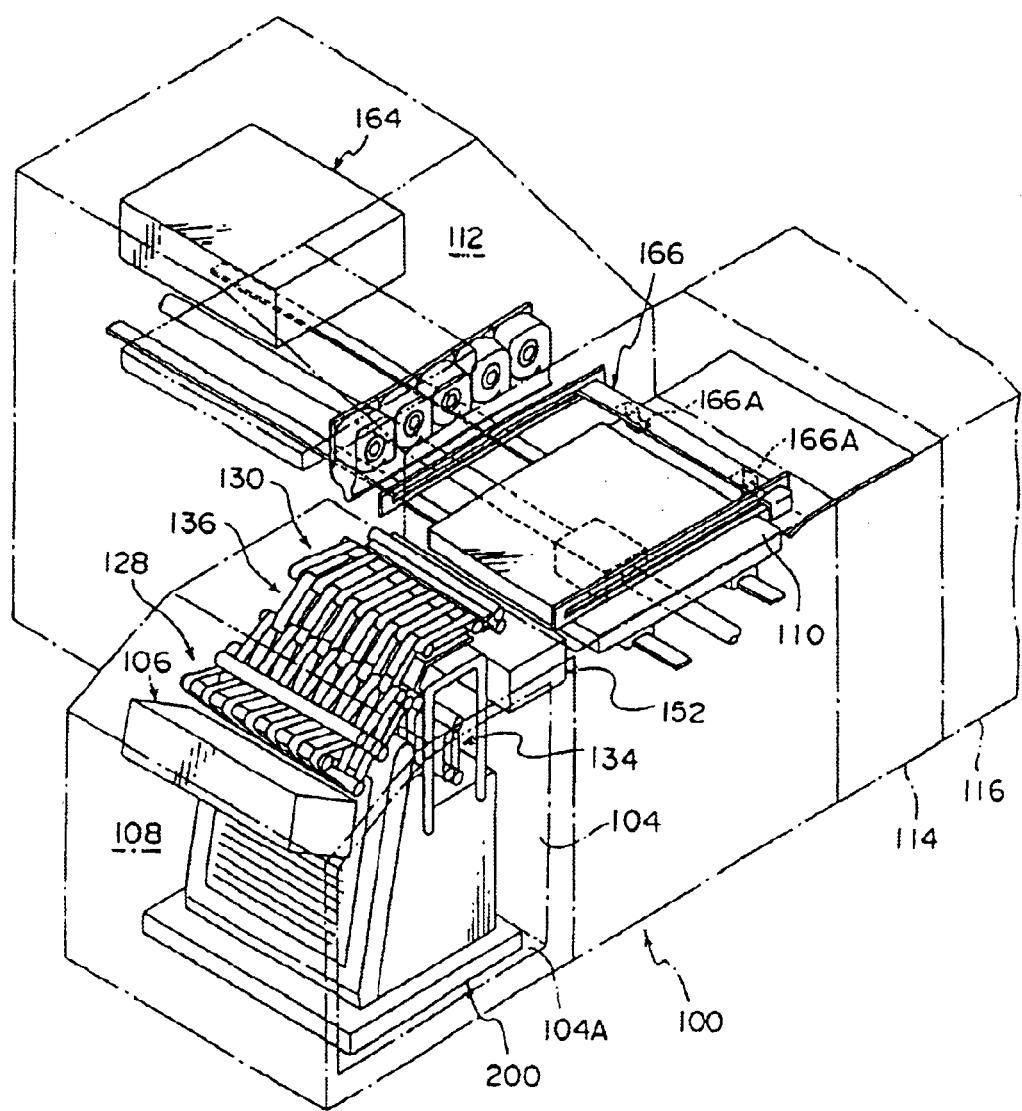
FIG. 1 is a perspective view which shows an overall structure of an automatic exposure apparatus according to an embodiment of the present invention.

FIG. 1 shows an automatic exposure apparatus 100 for photopolymer plates according to an embodiment of the present invention.

The automatic exposure apparatus 100 is formed by: a plate supplying section 108 including a plate accommodating portion 104 in which photopolymer plates 102 (see FIG. 2) placed on a carriage 200 is accommodated, and a sheet feeding portion 106 for taking out the photopolymer plates 102 accommodated in the plate accommodating portion 104; a surface table 110 on which the photopolymer plate 102 is positioned and held; and an exposure section 112 in which an image is recorded on the photopolymer plate 102 positioned on the surface table 110.

An automatic processing apparatus 116 can be provided at a downstream side of the automatic exposure apparatus 100 via a buffer section 114, and supplying of plates, exposure, and processing can all be automatically processed.

Figure 2:
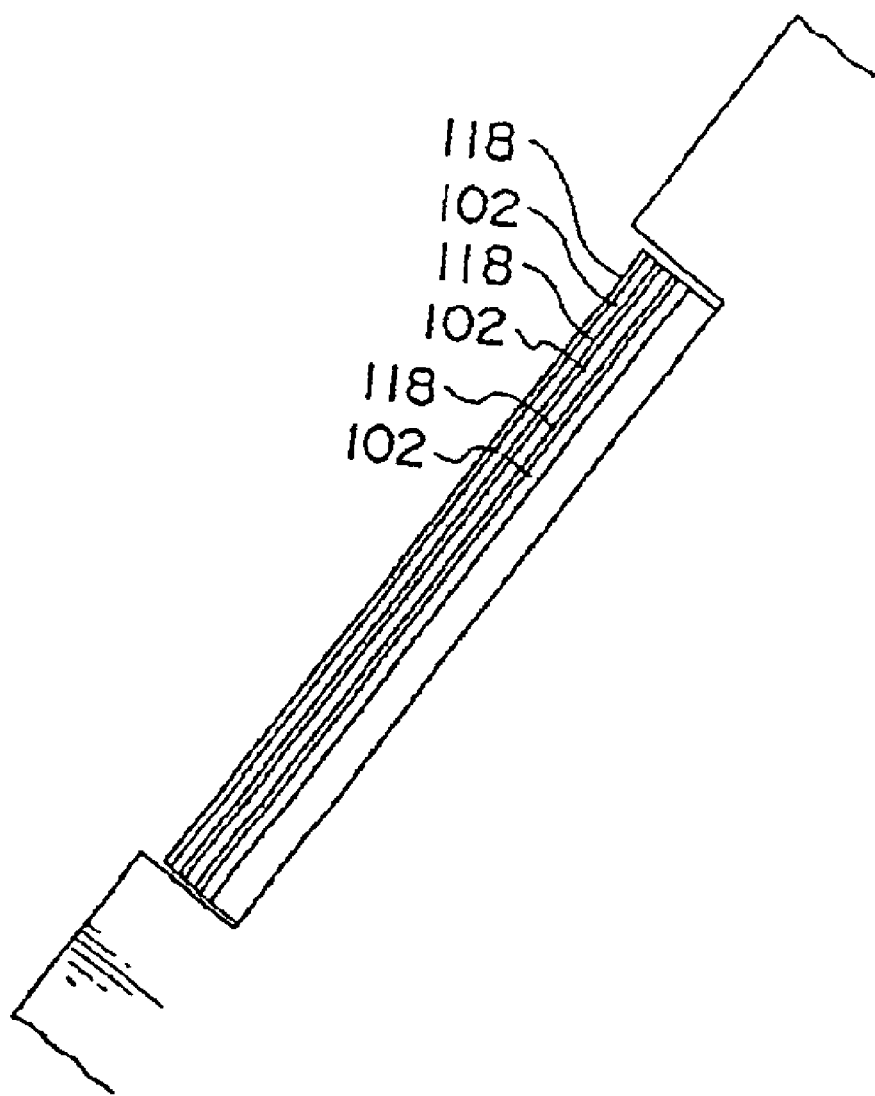
FIG. 2 is a side view which shows a state in which photopolymer plates and interleaf papers are stacked in a magazine.
Figure 3:
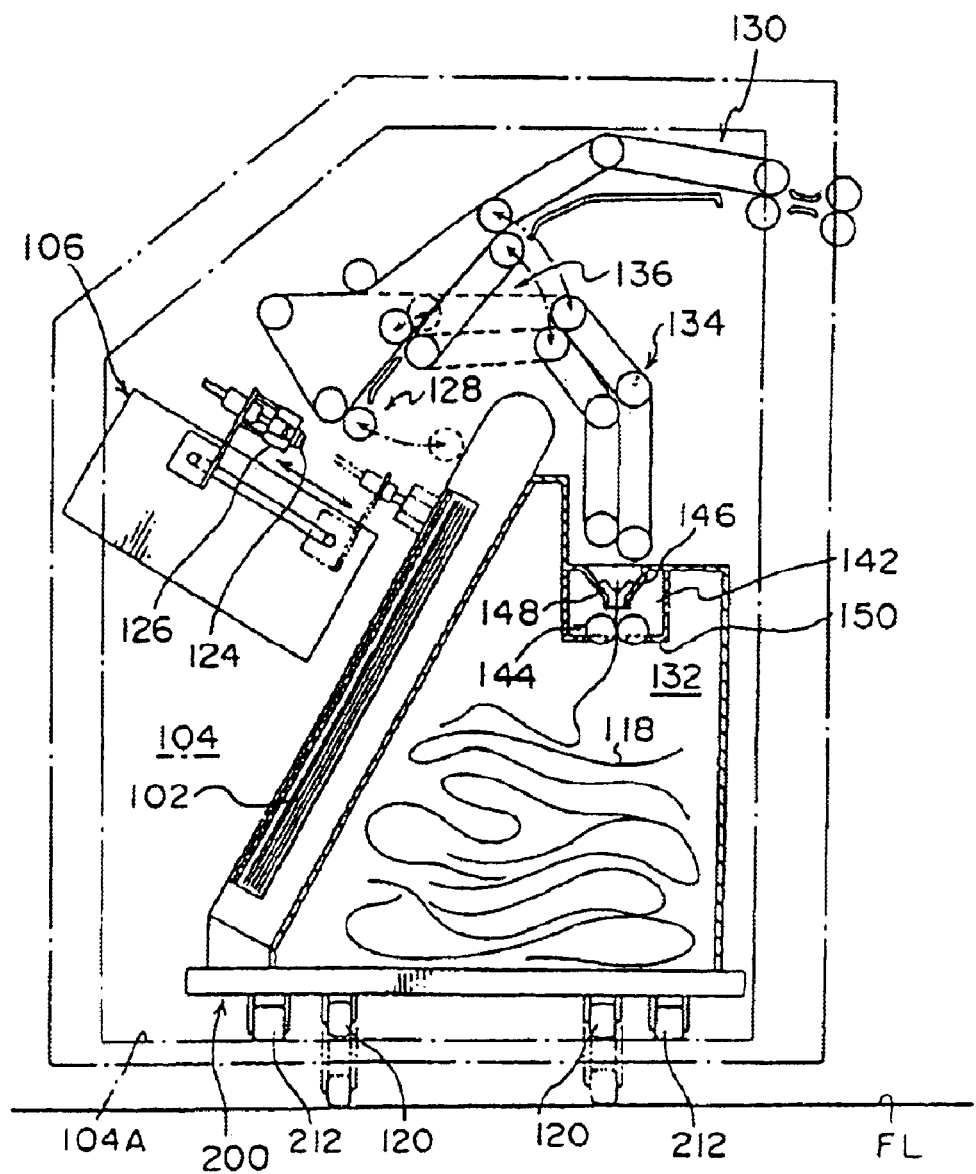
FIG. 3 is a side view of a plate supplying section.

As shown in FIG. 3, a plurality of photopolymer plates 102 are placed against an inclined surface in the plate accommodating portion 104 and a carriage 200 can be accommodated in the plate accommodating portion 104. As shown in FIG. 2, an interleaf paper 118 for protecting the surface of the photopolymer plate 102 is applied to the surface of each of the photopolymer plates 102. As a result, the photopolymer plates 102 and the interleaf papers 118 are alternately stacked with one another.

The plate accommodating portion 104 includes a floor portion 104A at a position higher than the floor surface FL, and the carriage 200 is provided so as to ride on the floor portion 104A above the floor surface FL. That is, the carriage 200 is supported via casters 120 with respect to the floor surface and the casters 120 can be moved between a position at which it projects from the carriage 200 (that is, the position indicated by the phantom lines in FIG. 3) and a position at which it is accommodated in the carriage 200 (that is, the position indicated by solid lines in FIG. 3).

When the casters 120 are moved to the accommodated position in such a manner as to be made retractable toward the upper side corresponding to an operation of accommodating the carriage 200 in the plate accommodating portion 104, auxiliary rollers 212 simultaneously correspond to the floor portion 104A. Thereafter, the carriage 200 is supported by the floor portion 104A via the auxiliary rollers 212.

The sheet feeding section 106 is provided above the plate accommodating portion 104. The sheet feeding section 106 is adapted to take out the photopolymer plates 102 and the interleaf papers 118 alternately from the stack and convey to the plate supplying section 108. The sheet feeding section 106 includes a sucker 124 which adheres by suction to the photopolymer plate 102 and the interleaf paper 118. Further, a suction fan 126 is provided, as auxiliary means for suction-adhering to the interleaf paper 118, in the vicinity and independently of the sucker 124. The sucker 124 and the suction fan 126 can be moved close to or apart from the surface of the interleaf paper 118 or the photopolymer plate 102 in the stack.

The photopolymer plate 102 is adhered by suction to the sucker 124 in such a manner as to be brought into contact therewith. In order that the interleaf paper 118 be adhered by suction to the sucker 124, the suction fan 126 is disposed slightly apart from the interleaf paper 118 (or may be brought into contact with the interleaf paper 118), and only the interleaf paper 118 which is formed as a light weight and thin paper, is sucked up by operating only the suction fan 126, and thereafter, the interleaf paper 118 is adhered by suction to the sucker 124. As a result, double suction at the time of suction-adhering to the interleaf paper 118 (that is, a state in which the photopolymer plate 102 located directly below the interleaf paper 118 is adhered by suction together with the interleaf paper 118) is prevented.

When the interleaf paper is adhered by suction, unless it is detected by a sensor that suction pressure is set in a certain range of a threshold value, suction is once stopped to release suction-adhesion to the interleaf paper, and an interleaf paper suction sequence is executed again. As a result, error frequency is reduced. The same applies also to suction-adhesion of the photopolymer plate 102. Further, a second retry sequence is different from the first sequence in that error frequency is further reduced (however, the processing time of the second sequence is longer than that of the first sequence).

The plate supplying section 108 is mainly divided into the following four portions: a shared conveying portion 128 which receives and conveys the photopolymer plate 102 or the interleaf paper 118 from the sheet feeding section 106; a photopolymer plate conveying portion 130 which receives the photopolymer plate 102 and conveys the same to the surface table 110; an interleaf paper conveying portion 134 which receives the interleaf paper 118 and conveys the same to an interleaf paper accommodating portion 132 (provided in the carriage 200); and a conveying switch portion 136 which guides the photopolymer plate 102 and the interleaf paper 118 from the shared conveying portion 128 by effecting a switching operation to the photopolymer plate conveying portion 130 and the interleaf paper conveying portion 134.

That is, the photopolymer plates 102 and the interleaf papers 118 are alternately stacked with one another, and therefore, each time they are each adhered by suction in the sheet feeding section 106, the conveying switch portion 136 is switched so that the photopolymer plate 102 and the interleaf paper 118 are each conveyed in a predetermined direction.

Figure 4A:
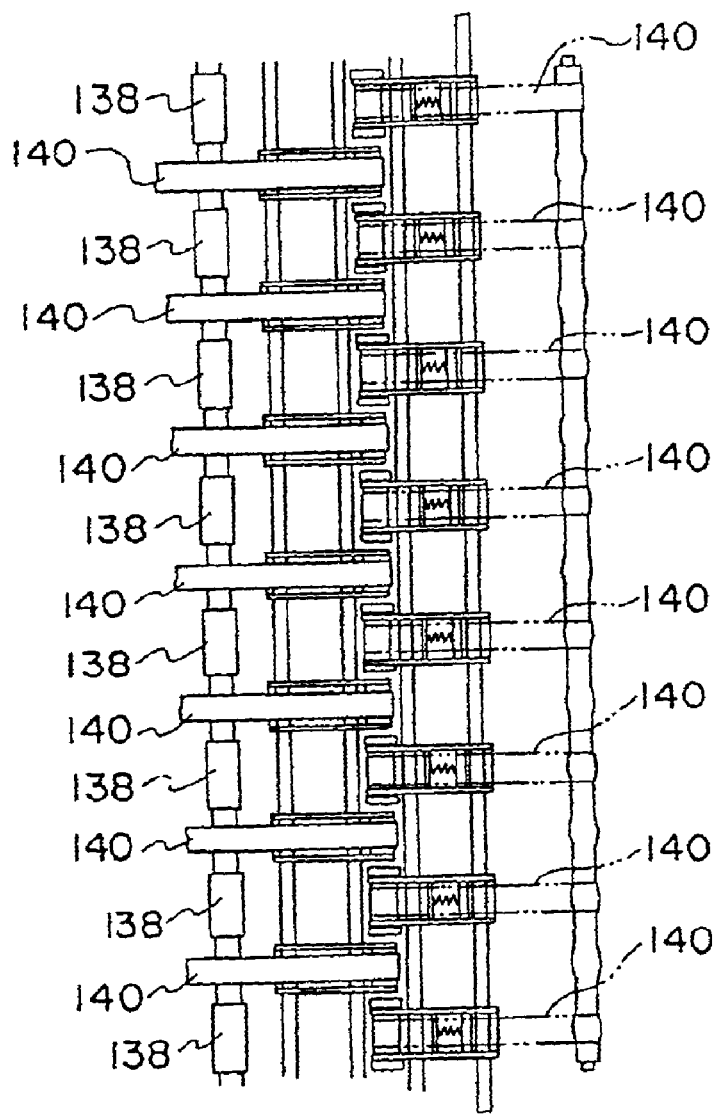
FIGS. 4A, 4B, and 4C are plan views which each show a portion of a conveying system of the plate supplying section.
Figure 4B:
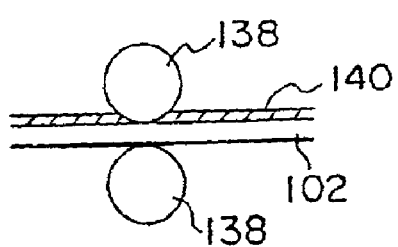

As shown in FIG. 4A, in each of the shared conveying portion 128, the photopolymer plate conveying portion 130, and the conveying switch portion 136, a conveying system in which skewered rollers 138 and narrow belts 140 are combined together, is used and the photopolymer plate 102 is mainly conveyed by the conveying system (see FIG. 4B). That is, the photopolymer plate 102 is conveyed by a strong holding force of the skewered rollers 138, and the narrow belts 140 each serve as a guide plate which moves synchronously with the conveying of the photopolymer plate 102.

Figure 4C:
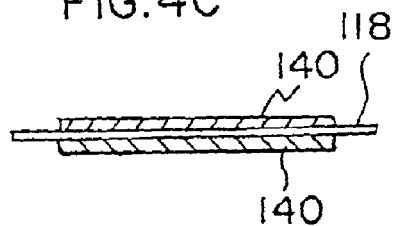

On the other hand, as shown in FIG. 4C, the interleaf paper conveying portion 134 is formed as a conveying system comprised of only the narrow belts 140, in which the interleaf paper 118 is conveyed by a weak holding force of the narrow belts 140.

Figure 5:
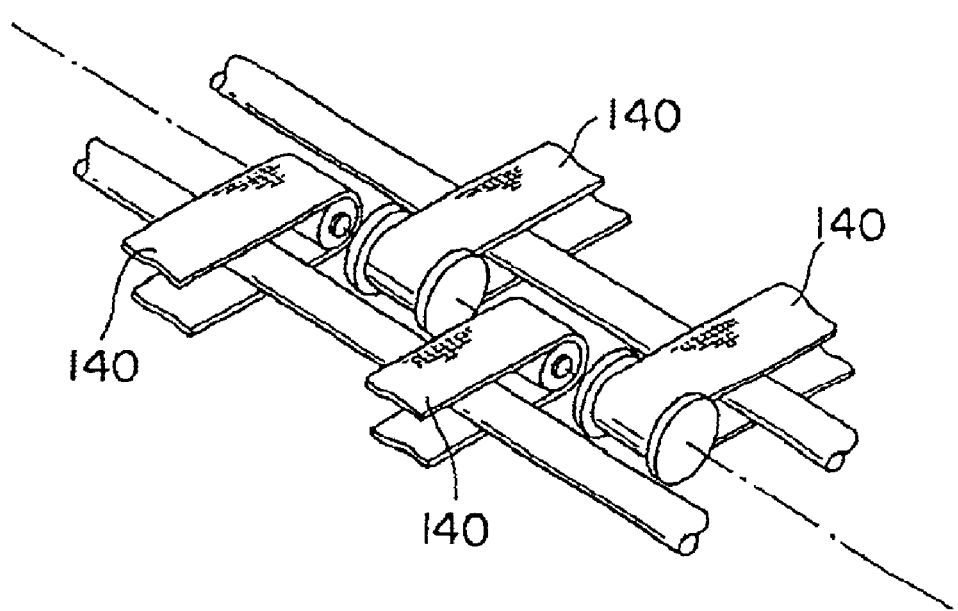
FIG. 5 is a perspective view which shows a transfer portion of another conveying system of the plate supplying section.

As shown in FIG. 5, in a transfer portion of each conveying portion, respective head (turn-back) portions of the belts 140 are alternately protruded in a skewered manner so that a concave region between adjacent belts 140 on one side faces a protruding head portion of the belt 140 on another side and a protruding head portion of the belt 140 on the one side faces a concave region between adjacent belts 140 on the another side (that is, a common coaxial conveying path is provided). Accordingly, a state in which, when the photopolymer plate 102 and the interleaf paper 118 are each transferred between the conveying portions, the photopolymer plate 102 and the interleaf paper 118 are wound in the skewered rollers 138 or in the narrow belts 140, is prevented.

As shown in FIG. 3, the interleaf paper 118 conveyed by the interleaf paper conveying portion 134 is guided to the interleaf paper accommodating portion 132 provided in the carriage 200. A pair of rollers 144 are provided at an insertion opening 142 of the interleaf paper 118 provided at an upper side of the interleaf paper accommodating portion 132 and are driven to rotate at a linear velocity which is a little higher (about 1.1 times) than a conveying speed set in the interleaf paper conveying portion 134. As a result, when the interleaf paper 118 is bridged between the interleaf paper conveying portion 134 and the rollers 144, the interleaf paper 118 is conveyed while a predetermined tension state is maintained, and jamming of the interleaf paper 118 caused by slackness formed therein, or the like can be prevented.

A tapered guide plate 146 of which widthwise dimension (in the direction of thickness of the interleaf paper 118) gradually decreases, is provided at the front side of the insertion opening 142. The tapered guide plates 146 facing each other are each provided with a charge removing brush 148 so as to remove charge from the interleaf paper 118 to be inserted in the insertion opening 142.

The above-described one pair of rollers 144 are skewered rollers, and a partition plate 150 is provided along irregularities (convexoconcave) formed by the skewered shape of the rollers 144. Accordingly, even if the interleaf paper 118 accumulated in the interleaf paper accommodating portion 132 partially contacts the rollers 144, wind-in of the interleaf paper 118 can be prevented by the partition plate 150.

As shown in FIG. 1, the photopolymer plate 102 conveyed by the photopolymer plate conveying portion 130 is separated from the photopolymer plate conveying portion 130 in a state of being horizontally conveyed, and is transferred to the surface table 110.

Figure 6A:
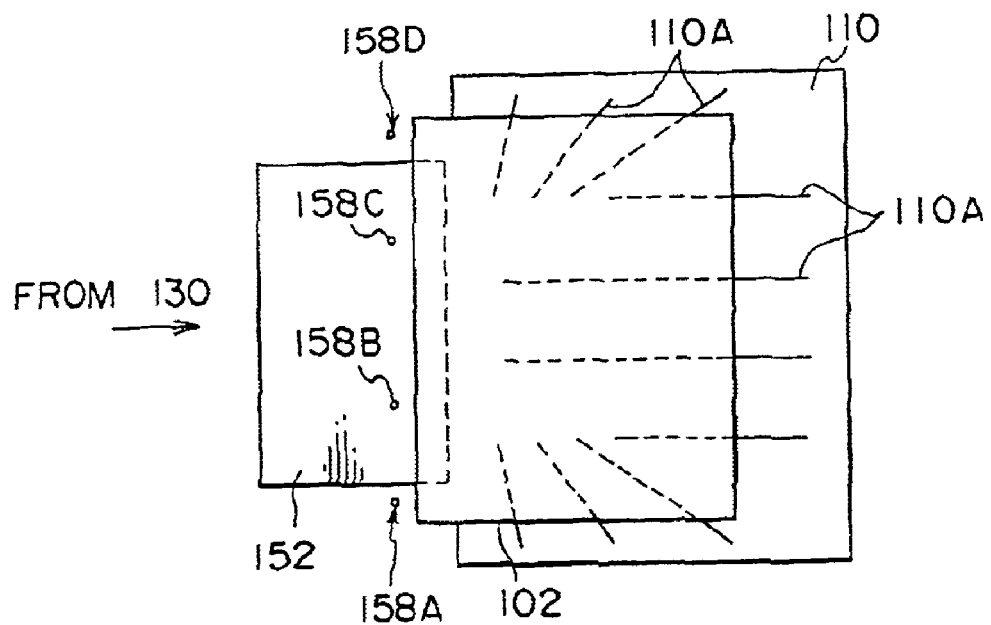
FIG. 6A is a plan view of a surface table.
Figure 6B:
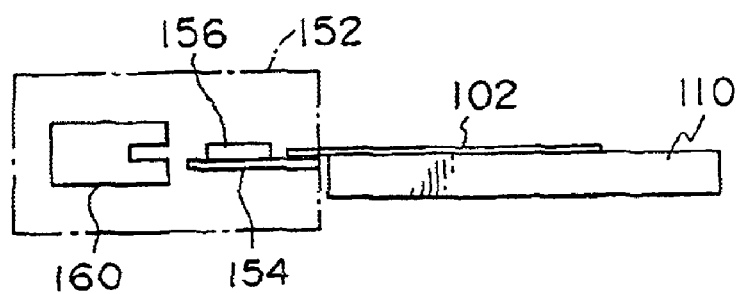
FIG. 6B is a side view of the surface table.

The upper surface of the surface table 110 is disposed at a position lower than a position at which the photopolymer plate 102 is horizontally conveyed by the photopolymer plate conveying portion 130, and there is a space or gap between the surface table 110 and the photopolymer plate conveying portion 130 in the direction in which the photopolymer plate 102 is conveyed. For this reason, the photopolymer plate 102 discharged from the photopolymer plate conveying portion 130 arrives on the surface table 110 in such a manner that the leading end thereof slightly hangs, and the trailing end of the photopolymer plate 102 in the conveying direction is positioned further at the upstream side of the surface table 110 in the conveying direction of the plate 102. As shown in FIGS. 6A and 6B, a temporary supporting plate 154 provided in a movable body 152 which can move close to and apart from the surface table 110, is disposed at the upstream side of the surface table 110 so as to prevent hanging of the photopolymer plate 102.

A pressing plate 156 which pushes the trailing end of the photopolymer plate 102 in the conveying direction is provided in the temporary supporting plate 154. When the pressing plate 156 pushes the trailing end of the photopolymer plate 102, a diagonal feed of the photopolymer plate 102 is cancelled, and the photopolymer plate 102 can be conveyed to a predetermined reference position in the conveying direction. The reference position is a position at which the trailing end of the photopolymer plate 102 in the conveying direction protrudes slightly from the surface table 110.

At the reference position, sensors 158A to 158D are provided at plural positions including two corners at the trailing end of the photopolymer plate 102 in the conveying direction. Due to the trailing end of the photopolymer plate 102 being detected by the sensors 158A to 158D, pushing by the pressing plate 156 is stopped. Further, the sensors 158A to 158D are also used to detect positions on the photopolymer plate 102 along the transverse direction perpendicular to the conveying direction. That is, the corner(s) of the photopolymer plate 102 and at least one of the sensors 158A to 158D are caused to coincide with each other by the surface table 110 moving in the transverse direction of the photopolymer plate 102 perpendicular to the conveying direction, and the position at which the corners of the photopolymer plate 102 and the sensors coincide with each other, is used as a base position when a punch hole (not shown) is formed on the photopolymer plate 102, and is also registered as an initial position of the photopolymer plate 102.

The position of the photopolymer plate 102 moved to the initial position is set so as to become a relative position for a scanning-exposure starting position in the exposure section 112. In this state, the photopolymer plate 102 is adhered by suction to and held by a suction groove 110A (see FIG. 6A) provided in the surface table 110.

A puncher 160 (see FIG. 6B) provided in the movable body 152 punches holes in the photopolymer plate 102 adhered by suction to and held by the surface table 110.

Further, the surface table 110 is allowed to reciprocate (in the same manner as to move in a direction perpendicular to the conveying direction for positioning of the photopolymer plate) at a uniform velocity between a first position at which the photopolymer plate 102 is received from the photopolymer plate conveying portion 130 (the position indicated by the solid lines in FIG. 1) and a second position at which the photopolymer plate 102 is accommodated in the exposure section 112 (the position indicated by the phantom lines in FIG. 1).

In the exposure section 112, a scanning unit 164 is provided at a position above the conveying path on the surface table 110. Main scanning (in a direction perpendicular to the moving direction of the surface table 110) is carried out using laser beams which are controlled so as to be switched in accordance with an image signal. Forward movement of the surface table 110 is sub-scan movement. As a result, during the forward movement of the surface table 110 to the exposure section 112, an image is recorded on the photopolymer plate 102 held on the surface table 110, and the photopolymer plate 102 is moved back to an original position by backward movement of the surface table 110. After the photopolymer plate 102 placed on the surface table 110 has been moved back to the original position, vacuum application (adhering and holding the photopolymer plate 102) is terminated thereby releasing the photopolymer plate 102.

Print data is transferred from a database terminal equipment such as an external personal computer to the exposure section 112, and data of one image is recorded in a hard disk 250 (see FIG. 8) provided in the exposure section 112. In the exposure section 112, at the time in which transfer of print data of one image is completed, recording (exposure) of an image on the photopolymer plate 102 is started.

Figure 7A:
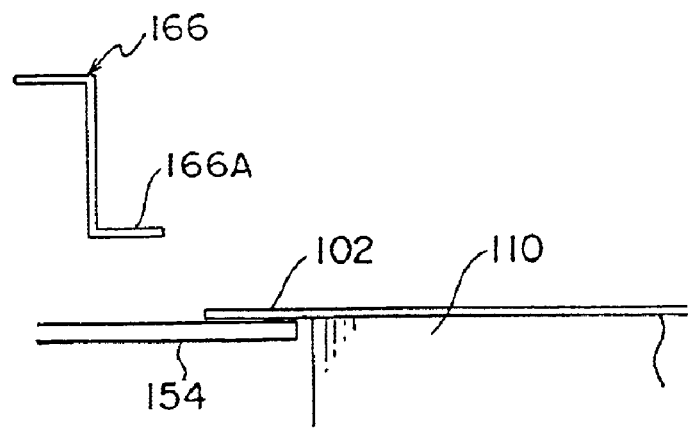
FIGS. 7A, 7B, and 7C are side views which each show the operation of a discharging mechanism section.

Corresponding to the surface table 110 having returned to its original position after recording of an image, the discharging mechanism section 166 placed in a waiting state at the side of the trailing end of the photopolymer plate 102 in a direction in which the photopolymer plate 102 is conveyed by the photopolymer plate conveying portion 130, passes through at an upper side of the surface table 110 and moves toward the leading end of the photopolymer plate 102 in the conveying direction (see FIG. 7A).

Figure 7B:
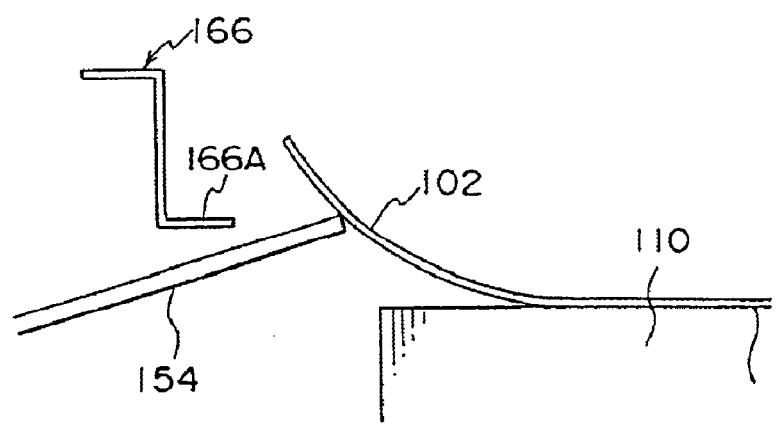
Figure 7C:
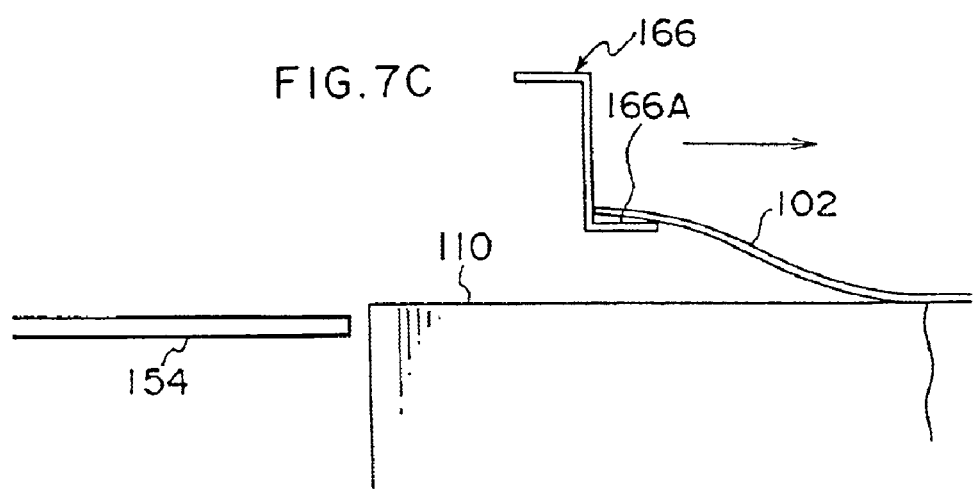

A hook portion 166A is formed in the discharging mechanism section 166 and the trailing end of the photopolymer plate 102 in the conveying direction is placed thereon. When the trailing end of the photopolymer plate 102 protruding from the surface table 110 is lifted up by the temporary supporting plate 154 provided in the movable body 152 (see FIG. 7B) and the discharging mechanism section 166 is moved in the direction in which the photopolymer plate 102 is conveyed, the photopolymer plate 102 is caught by the hook portion 166A and is conveyed to the downstream side of the surface table 110 accompanied with movement of the discharging mechanism section 166 (see FIG. 7C). The buffer section 114 and the automatic processing apparatus 116 are provided sequentially at the downstream side of the surface table 110, and the photopolymer plate 102 is smoothly conveyed while eliminating the difference between the discharging speed set in the discharging mechanism section 166 and the conveying speed set in the automatic processing apparatus 116.

Control of Conveying of the Photopolymer Plate 102

FIG. 8 shows a control block diagram which controls conveying of the photopolymer plate, which links with transfer of print data.

The exposure section 112 includes an exposure control portion 252 to control operation of an exposure system (main scan by light beams, and sub-scan by the surface table 110). Connected to the exposure control portion 252 is the above-described hard disk 250. Other image recording media such as a memory (SDRAM), MO, or ZIP may also be used in place of the hard disk 250.

A database terminal 254 provided outside and comprised of a personal computer or the like is connected to the exposure control portion 252, and print data is transferred from the terminal 254 to the exposure control portion 252. The exposure control portion 252 stores the transferred print data in the hard disk 250, and gives information about start of print-data transfer to a conveying-control unit 256.

The conveying-control unit 256 controls, based on a received signal notifying start of print-data transfer, a supply-convey driver 258 to operate each driving portion of the conveying system, thereby allowing conveying of the photopolymer plate 102.

Further, in the conveying-control unit 256, when a predetermined time has elapsed from a starting time of print-data transfer, conveying of the photopolymer plate 102 is temporarily stopped by a stop-control portion 260. The time at which the conveying is temporarily stopped is synchronized with the time at which the photopolymer plate 102 is conveyed to the surface table 110, and is immediately before positioning of the photopolymer plate is carried out for formation of a punch hole thereon.

Moreover, in a determination control portion 262 provided in the conveying-control portion 256, a remaining amount of print data to be transferred (an amount of print data, in the terminal 254, to be transferred), and data amount which can be transferred in a time for which the photopolymer plate 102 is conveyed from the temporarily stopping position to a recording start position in the exposure section 112, are compared.

In the present embodiment, the amount of print data is in the range from 100 Mb to 1 Gb, or thereabouts. Further, the transfer rate is approximately 7 Mb/second. Accordingly, the time for transfer of the minimum amount of data (100 Mb) is about 14.3 seconds, and the time for transfer of the maximum amount of data (1 Gb) is about 143 seconds. On the other hand, the time for which the printing plate is moved from a conveying starting position to a punch hole forming process (a period from a time when conveyance of the printing plate is started to a time when the printing plate arrives at the position in which the punch hole forming process is performed) is about 15 seconds, and the time for which the printing plate is moved to the exposure stage (a period from a time when conveyance of the printing plate is started to a time when the printing plate arrives at the position in which the exposure is performed) is about 30 seconds.

In the present embodiment, in the determination control portion 262, based on the above-described conditions, the time from the temporarily stopping position to the image recording position (the position at which the exposure is performed to the printing plate) is set to be 15 seconds and the amount of data which can be transferred in 15 seconds is calculated from the above-described transfer rate (7 Mb×15=105 Mb).

That is, it is determined whether the remaining amount of print data to be transferred from the terminal 254 comes to 105 Mb.

In the determination control portion 262, when the above-described determination is made affirmative (the remaining amount of print data to be transferred, comes to 105 Mb), a signal which requires restart of conveying is given to a release control portion 264. When the release control portion 264 receives this signal, it controls the supply-convey driver 258 to restart conveying.

As a result, the time at which transfer of print data is completed, and the time at which conveying of the photopolymer plate 102 to the image recording position is completed (the time at which the photopolymer plate 102 arrives at the image recording position), coincide with each other, and recording of an image is carried out.

When image recording is completed, an image-recording ending signal is transferred from the exposure control portion 252 to the conveying-control portion 256. The conveying-control portion 256 controls, based on the received signal, a discharge-convey driver 266 and moves the surface table 110 from the exposure section 112 to its original position to thereby discharge the photopolymer plate 102.

A description will be hereinafter given of operation of the present embodiment.

Figure 10A:
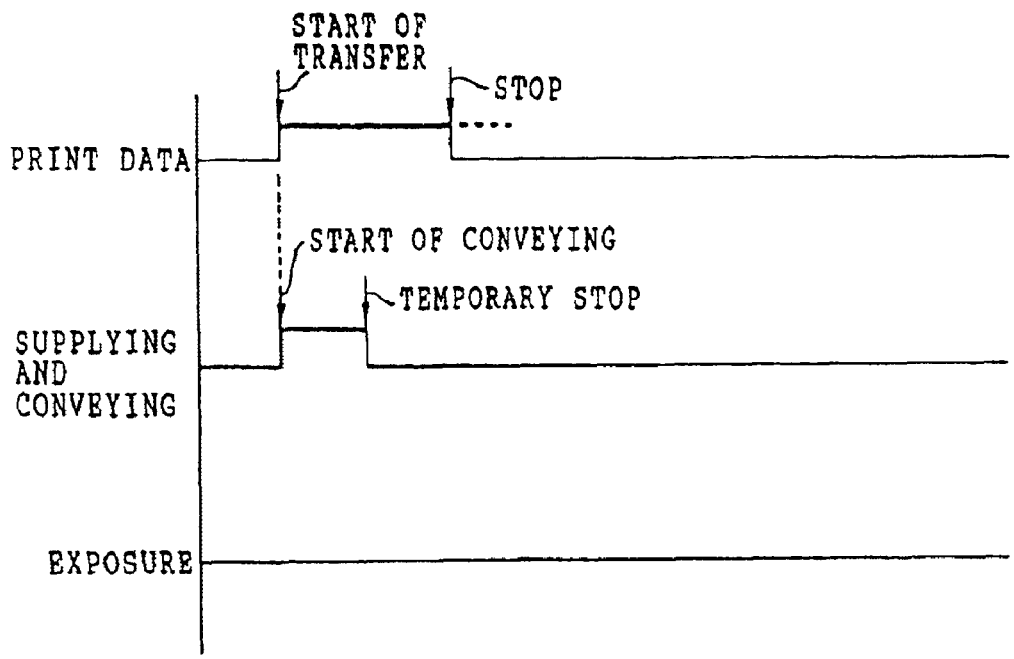
FIGS. 10A and 10B are a timing chart according to an embodiment of the present invention, and a conventional timing chart respectively, for controlling conveying of the photopolymer plate, which links with transfer of print data (when transfer of print data is temporarily stopped).

FIGS. 9 and 10A each show a timing chart which controls conveying of the photopolymer plate 102, which links with transfer of print data.

FIG. 9 is a timing chart of normal conveying control, and when transfer of print data is started, supplying and conveying of the photopolymer plate 102 is thereby started.

Thereafter, conveying of the photopolymer plate 102 is temporarily stopped at a predetermined position. This position is set at a position at which the photopolymer plate 102 is located after being conveyed to the surface table 110 and before positioning thereof is effected.

Even when conveying of the photopolymer plate 102 is temporarily stopped, print data is continuously transferred. When the remaining amount of print data comes to 105 Mb (which corresponds to the time for which the photopolymer plate 102 is conveyed from the temporarily stopping position to the image recording position, that is, 15 seconds), conveying of the photopolymer plate 102 is restarted, and the photopolymer plate 102 arrives at the image-recording start position after 15 seconds. Further, the transfer of print data is entirely completed after 15 seconds. As a result, there is no possibility that delay in processing due to temporary stop of conveying may occur.

When transfer of print data is completed and the photopolymer plate 102 is positioned at the image recording position, exposure starts.

When the exposure is completed, an operation of conveying to discharge the photopolymer plate 102 is started, and the photopolymer plate 102 is discharged out of the apparatus or conveyed to the developing apparatus in a subsequent process.

Next, a description will be given of a case in which transfer of print data is midway stopped based on the timing chart shown in FIG. 10A.

The timing chart of FIG. 10A is different from that of FIG. 9 in that transfer of print data is midway stopped after transfer of print data is started.

When transfer of print data is stopped, an operation of conveying the photopolymer plate has already been stopped temporarily, and no punch hole is formed on the photopolymer plate 102. Accordingly, when transfer of print data is stopped, an operation of conveying to discharge the photopolymer plate 102 is started and the photopolymer plate 102 is discharged. The discharged photopolymer plate 102 has no punch hole formed thereon, and therefore, it can be reused.

Figure 10B:
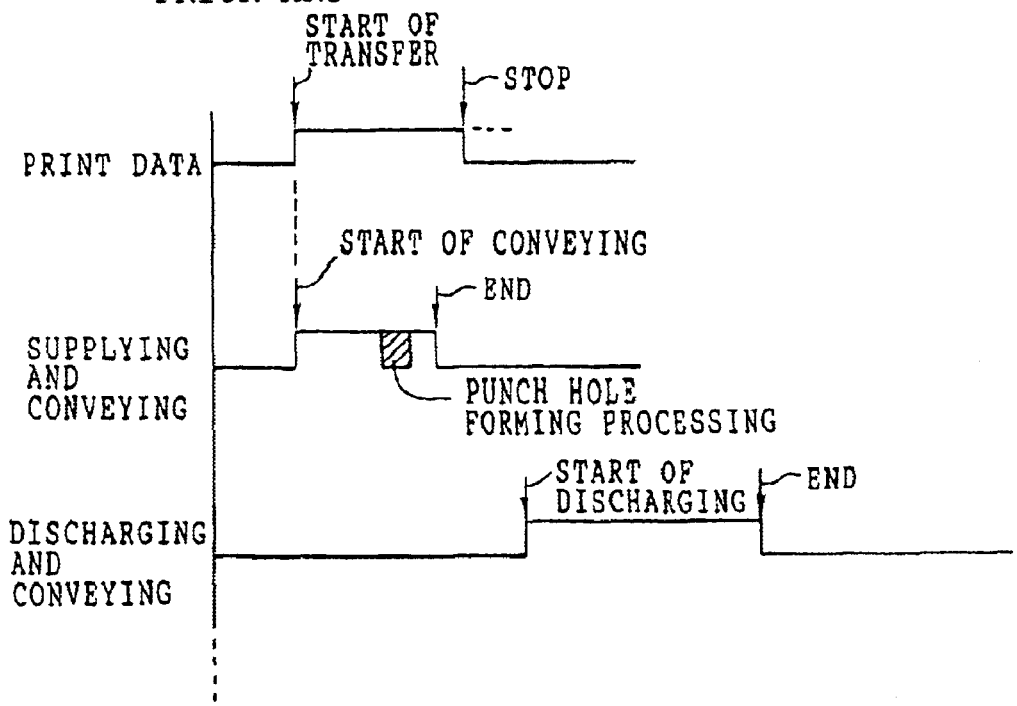

As shown in FIG. 10B, conventionally, the punch-hole forming operation has already been completed at the time of print-data transfer being stopped, and the photopolymer plate 102 has arrived at the image recording position. Accordingly, a discharged photopolymer plate 102 has a punch hole formed thereon, and therefore, the photopolymer plate 102 cannot be reused and is discarded.

Thus, according to the present embodiment, conveying of the photopolymer plate 102 starting concurrently with transfer of print data is temporarily stopped immediately before the punch-hole forming operation (processing), and the photopolymer plate 102 is placed on standby. Therefore, when transfer of print data is midway stopped, the photopolymer plate 102 is placed in a reusable state at a high probability, and the photopolymer plates 102 to be discarded can be reduced. Further, the standby time of the photopolymer plate 102 and the time at which conveying is restarted are determined based on the transfer rate of print data and the remaining conveying time from the temporary stopped position to the image recording position (in the present embodiment, it is fixed at 15 seconds). Therefore, there is no possibility that the delay in image recording processing caused by temporary stop of the conveying may occur.

In the present embodiment, the time needed for conveying the photopolymer plate 102 after restart of conveying is set to be 15 seconds on the basis of the general transfer rate of print data. However, there are cases in which the transfer rate of print data may vary depending on the state of an image (for example, data only comprised of characters (monochrome data), color classification data corresponding to a full color image, or DTP). Therefore, the conveying time after restart of conveying may be suitably set based on the transfer rate corresponding to the state of an image.

Further, there may be provided notifying means which lights a blue light lamp when the photopolymer plate 102 can be reused even if transfer of print data is stopped, and lights a red light lamp after completion of the above-described state, or which indicates, by a timer, the time until when the photopolymer plate is made reusable. The blue light lamp may be lit when the photopolymer plate 102 is not punched, and the red light lamp may be lit when the photopolymer plate 102 is punched. The time until when the photopolymer plate is punched may be displayed by the timer.

As described above, the method of conveying a recording material and the device for controlling conveying of a recording material according to the present invention have an excellent effect in that, when an image is recorded on a recording material while concurrently effecting transfer of print data and conveying the recording material, a probability at which the recording material at the time that cancellation of the exposure is determined is placed in an unprocessed state, can be made higher.

What is claimed is:

1. A method of conveying a recording material, in which the recording material is conveyed to an image recording stage in an image recording apparatus in which an image is recorded on the recording material based on print data transferred at a predetermined transfer rate, said method comprising the steps of:

starting concurrent processing of transfer of the print data and conveying of the recording material;

temporarily stopping conveying of the recording material, when a predetermined amount of the print data is not received, immediately before a process for working the recording material;

calculating, based on the predetermined transfer rate, an amount of the print data which can be transferred in a time for which the recording material is conveyed from a position at which the recording material is temporarily stopped, to an image recording position; and restarting conveying of the recording material at a time at which an amount of print data which has not been transferred comes to the calculated amount of print data.

2. The method of conveying a recording material according to claim 1, wherein when transfer of the print data is stopped until the recording material is temporarily stopped or during a period in which the recording material is temporarily stopped, the recording material is reused.

3. The method of conveying a recording material according to claim 1, wherein the process for working the recording material is a process of positioning the recording material at a predetermined position and of forming at least one punch hole on the recording material.

4. The method of conveying a recording material according to claim 2, wherein the process for working the recording material is a process of positioning the recording material at a predetermined position and of forming at least one punch hole on the recording material.

5. A device for controlling conveying of a recording material, comprising:

a transfer section for transferring print data;

a conveying section which starts conveying of the recording material, based on start of transfer of print data by said transfer section, and conveys the recording material to a predetermined recording stage;

a stop-control section for temporarily stopping conveying of the recording material when a predetermined amount of print data is not received at a position, at which the recording material can be positioned at the recording stage in a predetermined time, midway in a conveying path of said conveying section;

a determination section which determines whether a remaining amount of print data transferred from said transfer section comes to an amount of print data which can be transferred in the predetermined time based on a transfer rate of the print data;

a release section which releases temporarily stopping conveying of the recording material by said stop-control section when the remaining amount of print data and the amount of print data which can be transferred in the predetermined time based on the transfer rate of the print data coincide with each other in said determination section; and a discharging section for discharging the recording material when transfer of print data from said transfer section is stopped before temporarily stopping conveying of the recording material by said stop-control section is released by said release section.

6. The device for controlling conveying of a recording material according to claim 5, wherein the predetermined time is set based on a process for working the recording material, and the position at which the recording material is stopped by said stop-control section, is provided at a position in which position the recording material is located before the process for working the recording material is carried out.

7. The device for controlling conveying of a recording material according to claim 6, wherein the process for working the recording material is a process of positioning the recording material at a predetermined position and of forming at least one punch hole on the recording material.

8. The device for controlling conveying of a recording material according to claim 5, wherein the recording material is a printing plate having a photosensitive layer on a support, and said device is applied to an automatic exposure apparatus for printing plates, in which a printing plate is passed onto a surface table while being conveyed in a predetermined direction, and located at a regular position on the surface table, and thereafter, positioning punch holes used when the printing plate is wound around a print drum at a predetermined position, are formed on the printing plate, and the printing plate is moved to a recording stage by moving the surface table, and an image is recorded on the printing plate based on the print data.

9. The device for controlling conveying of a recording material according to claim 6, wherein the recording material is a printing plate having a photosensitive layer on a support, and said device is applied to an automatic exposure apparatus for printing plates, in which a printing plate is passed onto a surface table while being conveyed in a predetermined direction, and located at a regular position on the surface table, and thereafter, positioning punch holes used when the printing plate is wound around a print drum at a predetermined position, are formed on the printing plate, and the printing plate is moved to a recording stage by moving the surface table, and an image is recorded on the printing plate based on the print data.

10. The device for controlling conveying of a recording material according to claim 7, wherein the recording material is a printing plate having a photosensitive layer on a support, and said device is applied to an automatic exposure apparatus for printing plates, in which a printing plate is passed onto a surface table while being conveyed in a predetermined direction, and located at a regular position on the surface table, and thereafter, positioning punch holes used when the printing plate is wound around a print drum at a predetermined position, are formed on the printing plate, and the printing plate is moved to a recording stage by moving the surface table, and an image is recorded on the printing plate based on the print data.

11. A method of conveying a recording material, in which the recording material is conveyed to an image recording position in an image recording apparatus in which an image is recorded on the recording material based on print data transferred at a predetermined transfer rate, said method comprising the steps of:

starting transfer of the print data and conveying of the recording material;

temporarily stopping conveying of the recording material at a predetermined position in a conveying path of the recording material;

calculating, based on the predetermined transfer rate, an amount of print data which can be transferred in a time required for which the recording material is conveyed from the predetermined position at which the recording material is temporarily stopped, to the image recording position; and restarting conveying of the recording material when an amount of the print data which has not been transferred, and the calculated amount of print data coincide with each other.

12. The method of conveying a recording material according to claim 11, wherein the predetermined position is related to a region in which predetermined processing is effected for the recording material.

13. The method of conveying a recording material according to claim 11, wherein when transfer of the print data is stopped until conveying of the recording material is temporarily stopped or during a period in which the recording material is temporarily stopped, the predetermined processing effected for the recording material is cancelled.

14. The method of conveying a recording material according to claim 12, wherein the predetermined processing effected for the recording material is formation of at least one punch hole on the recording material.

15. The method of conveying a recording material according to claim 11, wherein a time at which the recording material arrives at the image recording position is substantially concurrent with a time at which transfer of the print data is completed.

16. The method of conveying a recording material according to claim 11, wherein a time at which the image can be recorded on the recording material at the image recording position, is substantially concurrent with a time at which transfer of the print data is completed.

17. A device for controlling conveying of a recording material, comprising:

a transfer section for transferring print data at a predetermined transfer rate;

a conveying section for conveying the recording material to an image recording position;

a stop-control section which temporarily stops conveying of the recording material at a predetermined position midway in a conveying path of said conveying section;

a determination section which makes a determination as to whether an amount of print data which has not been transferred among the print data transferred from said transfer section, coincides with an amount of print data which can be transferred in a time required for which the recording material is conveyed from the predetermined position at which the recording material is temporarily stopped, to the image recording position, which time is based on the predetermined transfer rate; and a release section which releases the temporary stopping of the recording material by said stop-control section when the amount of the print data which has not been transferred, and the amount of print data which can be transferred, coincide with each other in said determination section.

18. The device for controlling conveying of a recording material according to claim 17, further comprising a discharging section which discharges the recording material when transfer of print data from said transfer section is stopped.

19. The device for controlling conveying of a recording material according to claim 17, wherein the predetermined position at which the recording material is temporarily stopped by said stop-control section, is related to a region in which predetermined processing is effected for the recording material.

20. The device for controlling conveying of a recording material according to claim 19, wherein the predetermined processing effected for the recording material is formation of at least one punch hole on the recording material.

21. The device for controlling conveying of a recording material according to claim 17, wherein the recording material is a printing plate having a photosensitive layer on a support, and positioning punch holes used when the printing plate is wound around a print drum, are formed in the printing plate, and the image is recorded on the printing plate based on the print data.

* * * * *